United States Patent
Huber et al.

[11] Patent Number: 5,952,565
[45] Date of Patent: Sep. 14, 1999

[54] DEVICE FOR CHECKING THE FUNCTION OF AN ELECTRONICALLY CONTROLLED REGULATING SYSTEM IN A MOTOR VEHICLE FOLLOWING A MANUFACTURING PROCESS

[75] Inventors: Gerd Huber; Anton Haas; Werner Bauer, all of Munich, Germany

[73] Assignee: Bayerische Motoren Werke AG, Germany

[21] Appl. No.: 09/085,753

[22] Filed: May 27, 1998

[30] Foreign Application Priority Data

May 27, 1997 [DE] Germany ............................ 197 22 188

[51] Int. Cl.⁶ ..................... G01M 15/00; G01M 17/00
[52] U.S. Cl. ................. 73/118.1; 701/31; 701/35
[58] Field of Search .................. 701/31, 35, 99, 701/101; 73/865.9, 116, 117.2, 117.3, 118.1

[56] References Cited

U.S. PATENT DOCUMENTS

| | | |
|---|---|---|
| 3,792,445 | 2/1974 | Bucks et al. ........................... 73/116 |
| 4,748,843 | 6/1988 | Schäfer et al. ........................ 73/117.3 |
| 4,969,104 | 11/1990 | Suzuki et al. ............................ 701/99 |
| 5,491,631 | 2/1996 | Shirane et al. ........................... 701/35 |
| 5,586,034 | 12/1996 | Takaba et al. ........................... 701/35 |
| 5,696,676 | 12/1997 | Takaba .................................... 701/31 |
| 5,717,595 | 2/1998 | Cherrington et al. ................. 73/117.3 |

FOREIGN PATENT DOCUMENTS

| | | |
|---|---|---|
| 32 32 416 | 3/1984 | Germany . |
| 43 30 312 | 3/1995 | Germany . |
| 44 00 203 | 8/1995 | Germany . |
| 44 19 189 | 12/1995 | Germany . |
| 195 22 937 | 1/1996 | Germany . |
| 44 46 512 | 6/1996 | Germany . |

*Primary Examiner*—George Dombroske
*Attorney, Agent, or Firm*—Evenson, McKeown, Edwards & Lenahan, P.L.L.C.

[57] ABSTRACT

Following installation of a device for functionally testing an electronically controlled regulating system in a motor vehicle, it is operated, and during its operation data is detected and stored in a test system at a production facility. The data collection occurs for the duration of a particular vehicle's operation over a defined distance at the production facility.

10 Claims, 1 Drawing Sheet

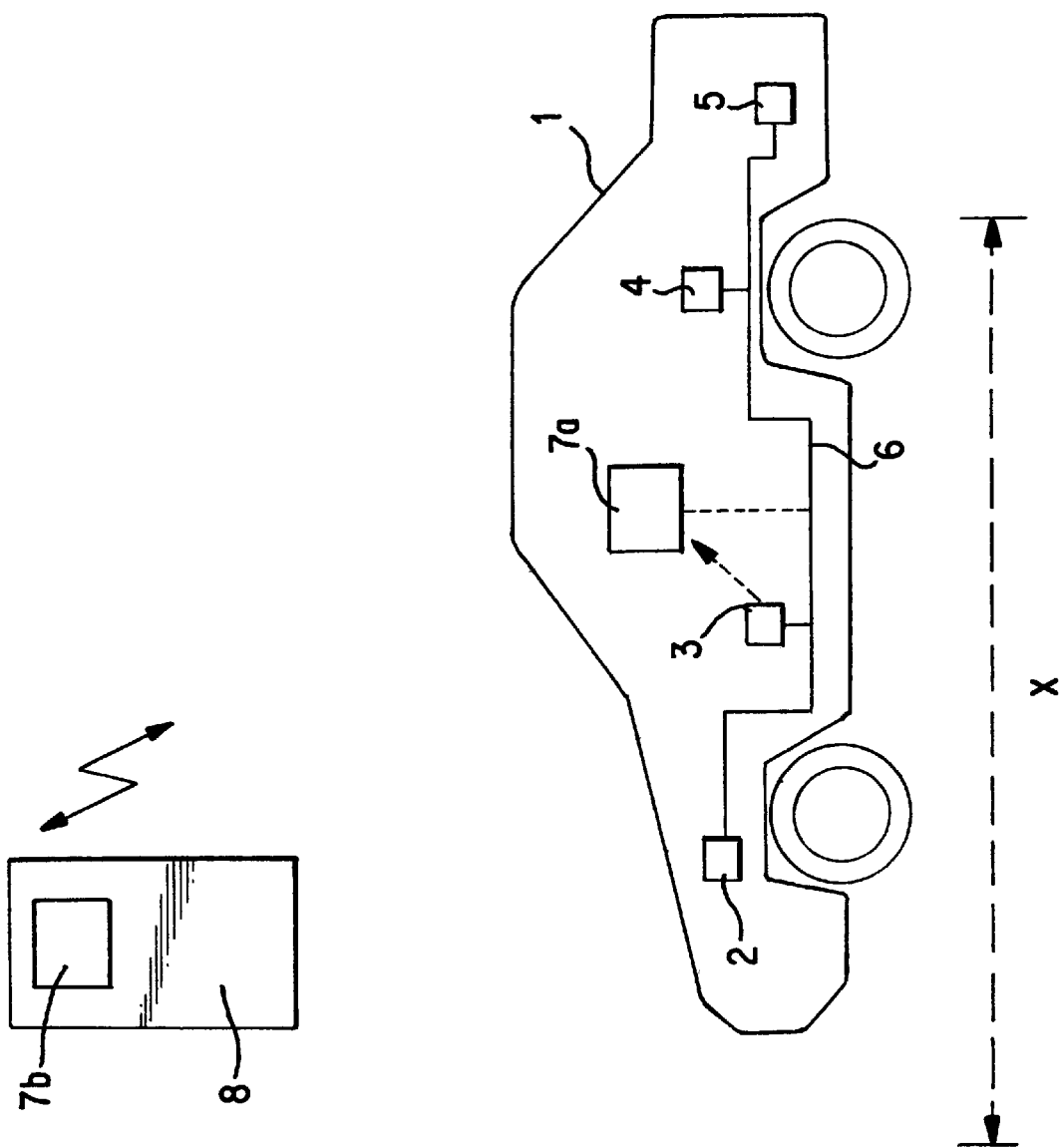

DEVICE FOR CHECKING THE FUNCTION OF AN ELECTRONICALLY CONTROLLED REGULATING SYSTEM IN A MOTOR VEHICLE FOLLOWING A MANUFACTURING PROCESS

BACKGROUND AND SUMMARY OF THE INVENTION

This application claims the priority of German application 197 22 188, filed May 27, 1997, the disclosure of which is expressly incorporated by reference herein.

The present invention relates to a device for checking the function of an electronically controlled regulating system in a motor vehicle following manufacture of the vehicle in a production facility.

Following several manufacturing processes (or at the end of the assembly line, i.e., after it has passed through all of the manufacturing processes), it is known that a motor vehicle in a production facility can be operated at least partially. In particular, with the vehicle at rest, the engine is started, the function of all the bulbs is checked, and other operating elements are actuated to test the functions with which they are associated.

To check the function of electronically controlled regulating systems, the partial delivery of error messages is determined. These error messages are deliverable (for example, via alarm bulbs or diagnostic devices) by the control devices associated with the electronically controlled regulating system.

A functional test of this kind, however, is insufficient, because of the complexity of the functions that an electronically controlled regulating system must perform during driving. Therefore, the function of such regulating systems is currently tested using separate, permanently installed test stands. Such permanently installed test stands involve high costs and considerable space usage. In addition, checking each individual regulating system by driving it to the test stand, initializing it, testing the system and driving back from the test stand consumes a considerable amount of time. Furthermore, as a result of changes in the regulating system, the integration of new activities into the existing test procedures requires considerable construction.

Hence, it is an object of the present invention to simplify a device for the functional testing of electronically controlled regulating systems in motor vehicles following manufacture of the vehicle in a production facility, while ensuring sufficient checking of the function associated therewith.

This and other objects and advantages are achieved by the functional testing device according to the invention, in which for the duration of a specific vehicle operating time over a distance to be covered in the production facility, the electronically controlled regulating system to be checked is activated after it is installed in the vehicle. In this way, the vehicle can actually be realistically started and driven (vehicle operation is the same as driving operation) or can be moved by towing it or using a conveyor belt.

During driving (i.e., vehicle operation), the data from the regulation system is recorded in a test system and stored. The defined vehicle operation can take place, for example, over a distance that must be covered at the production facility. For the defined vehicle operation, for example, certain driving parameters (such as distance segments, curve radii, temperatures, etc.) and/or operating guidelines (for example, rapidly depressing the accelerator, operating the brakes, steering movements, gearshifts, etc.) can be specified. This defined vehicle operation is the same for all vehicles. This ensures that the recorded and stored data for the individual regulating systems of different vehicles can be compared. The data can be evaluated at any suitable location (for example at a test-completion computer). After specified vehicle operations over specific distances (in order to save time), it is now possible to evaluate the recorded and stored data in parallel with additional manufacturing processes.

In other embodiments of the present invention, the test system for recording and storing the data from the regulating system can be connected in the vehicle to the regulating system to be checked, i.e., it can be on board the vehicle during the measuring run or can be located outside the vehicle and communicate without wires with the regulating system during the measuring run.

As a result of this functional test, according to the objects of the present invention, separate test stands are eliminated and realistic operating states are produced because of a vehicle operation that is defined while the electronically controlled regulating systems are activated.

Other objects, advantages and novel features of the present invention will become apparent from the following detailed description of the invention when considered in conjunction with the accompanying drawing.

BRIEF DESCRIPTION OF THE DRAWING

The sole FIGURE shows a device for the functional testing of an electronically controlled regulating system in a motor vehicle via a test device that is on board the vehicle during the measurement run.

DETAILED DESCRIPTION OF THE DRAWING

The sole FIGURE shows a plurality of electronically controlled regulating systems incorporated into a motor vehicle 1. Control devices 2 thru 5 are associated with each of the electronically controlled regulating systems. The control devices are connected to each other via a data bus 6 (for example, a CAN bus). Vehicle 1 is located at a production facility, i.e., at the end of all the manufacturing processes of the motor vehicle. Vehicle 1, however, must still travel a distance x in the production facility. Over this distance x, a driver (or, for example, an automatic transport device) operates vehicle 1. A specific type of driving operation or vehicle operation is specified. For example, driving parameters such as kickdown, full brake application, or rapid steering movements are specified for a partial distance that is also specifiable.

The vehicle operation thus defined is set such that the electronically controlled regulating system to be checked (for example, the regulating system associated with control device 3) is activated. If the electronically controlled regulating system associated with control device 3 is an automatic transmission, for example, the vehicle operation thus defined is preferably specified such that shifting processes must be carried out over x (where x is the distance to be covered). On the other hand, if an electronically controlled regulating system is provided for if automatic shock absorber regulation, the vehicle operation defined is preferably specified so that the suspension is caused to top out and bottom out relative to the wheels.

The regulating systems, or their control devices that are activated by the defined vehicle operation, output data on data bus 6. This data can be detected and stored by a test system 7a or 7b. For this purpose, test system 7a is present, for example, on board the vehicle during the measuring run. Test system 7a can be connected directly to the control device of a regulating system to be checked, or can be connected indirectly by data bus 6 with this control device. Alternatively, a test system 7b for detecting and storing the data from the activated regulating system to be checked can be located outside the vehicle, for example, in a stand system 8, and can communicate without wires (by radio, for example) with the regulating system to be checked. Communication between test systems 7a or 7b and a specific regulating system (or its control device) is performed, for example, using an identification code associated with the electronically controlled regulating systems. The measured data can be processed, for example, in a mathematical vehicle model (in order, for example, to detect deviations of individual sensors from one another). A statistical evaluation of all the vehicle measurements permits early recognition of error trends and more accurate definitions of the test specifications.

It is clear from this embodiment according to the present invention that the need for separate test stands is eliminated. As a result of the measurements performed over a set distance at the production facility, a function test does not require further expenditure of time. Moreover, the function is tested during vehicle operations which are realistic and not by simulated signals. In addition, it should be noted that the method for function testing according to the objects of the present invention can be used not only at production facilities but also at customer service departments and in garages.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

We claim:

1. A device for testing functionality of an electronically controlled regulating system in a motor vehicle following substantial manufacture of the motor vehicle at a production facility, comprising:

a test system for detecting data output from the electronically controlled regulating system;

means included in said system for storing said data output from the electronically controlled regulating system; and means for operating the vehicle over a defined duration according to a predetermined operating sequence which operating sequence activates said electronically controlled regulating system to send data to said test system.

2. The device according to claim 1, wherein the test device is connected in the vehicle with the regulating system.

3. The device according to claim 1, wherein the test device is located outside the vehicle and communicates remotely with the regulating system.

4. The device according to claim 1, wherein the predetermined sequence includes at least one of distance segments, curve radii and temperatures.

5. The device according to claim 1, wherein the predetermined sequence includes at least one of rapidly depressing a vehicle accelerator, operating vehicle brakes, steering movements and shifting gears.

6. A method of testing functionality of an electronically controlled regulating system in a motor vehicle following substantial manufacture of the motor vehicle, comprising:

operating the vehicle over a defined duration according to a predetermined uniform sequence which activates said electronically controlled regulating system;

detecting data output by said electronically controlled regulating system in a test system during said predetermined uniform sequence; and storing detected data for analysis to evaluate functional operability of said electronically controlled regulating system.

7. Method of manufacturing vehicles which includes an electronically controlled regulating system, comprising:

assembling said vehicles;

operating said vehicles over a defined duration according to a predetermined uniform sequence which activates said electronically controlled regulating system;

detecting data output by said electronically controlled regulating system during said predetermined uniform sequence; and storing detected data for analysis to evaluate functional operability of said electronically controlled regulating system.

8. The method according to claim 7, further comprising:

communicating remotely with the electronically controlled regulating system via a test device located outside of the vehicle.

9. The method according to claim 7, wherein the predetermined uniform sequence is at least one of distance segments, curve radii and temperatures.

10. The device according to claim 7, wherein the predetermined uniform sequence is at least one of rapidly depressing a vehicle accelerator, operating vehicle brakes, steering movements and shifting gears.

* * * * *